United States Patent
Choi et al.

(10) Patent No.: US 6,504,748 B2
(45) Date of Patent: Jan. 7, 2003

(54) FERROELECTRIC RANDOM ACCESS MEMORY DEVICE

(75) Inventors: Mun-Kyu Choi, Suwon (KR); Byung-Gil Jeon, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/931,617

(22) Filed: Aug. 16, 2001

(65) Prior Publication Data
US 2002/0051377 A1 May 2, 2002

(30) Foreign Application Priority Data
Oct. 30, 2000 (KR) .............................. 00-64055

(51) Int. Cl.$^7$ .............................................. G11C 11/22
(52) U.S. Cl. .................................. 365/145; 365/189.09
(58) Field of Search ............................ 365/145, 189.09, 365/125, 189.01

(56) References Cited

U.S. PATENT DOCUMENTS

| | | | |
|---|---|---|---|
| 4,946,710 A | 8/1990 | Miller et al. | 427/126.3 |
| 5,028,455 A | 7/1991 | Miller et al. | 427/126.3 |
| 5,598,366 A * | 1/1997 | Kraus et al. | 365/145 |
| 5,608,667 A * | 3/1997 | Osawa | 365/145 |
| 6,023,438 A * | 2/2000 | Tanaka et al. | 365/145 |
| 6,377,494 B1 * | 4/2002 | Maruyama | 365/145 |

* cited by examiner

*Primary Examiner*—Hoai Ho
(74) *Attorney, Agent, or Firm*—Mills & Onello, LLP

(57) ABSTRACT

A nonvolatile memory device comprises a plate line driving circuit having a hierarchical word line structure. The plate line driving circuit is coupled to plate lines corresponding to a main word line. The plate line driving circuit transmits a plate line drive signal to the plate lines when the main word line is selected, and connects the plate lines to the main word line when the main word line is unselected. Therefore, a floating condition in the plate lines when the main word line is unselected can be prevented.

7 Claims, 3 Drawing Sheets

FERROELECTRIC RANDOM ACCESS MEMORY DEVICE

This application relies for priority upon Korean Patent Application No. 2000-64055, filed on Oct. 30, 2000, the contents of which are herein incorporated by reference in their entirety.

FIELD OF THE INVENTION

The present invention generally relates to a semiconductor memory device and, more specifically, to a ferroelectric random access memory (RAM) device.

BACKGROUND OF THE INVENTION

Nonvolatile memory devices (NVMs) maintain stored data with applied power, as well as following removal of power. Such devices are realized by adopting a ferroelectric material, such as a PZT, having hysteresis characteristics.

Lead-zirconate-titanate, commonly referred to as PZT, is a well-known material used in integrated circuits. The use of PZT is disclosed in U.S. Pat. Nos. 5,028,455 and 4,946,719 issued to William D. Miller et al., and B. M. Melnick, et al., "Process Optimization and Characterization of Device Worthy Sol-Gel Based PZT for Ferroelectric Memories", in Ferroelectrics, Vol 109, pp. 1–23 (1990).

Adoption of PZT in realizing memory cells of the NVMs enables the NVMs to be constructed in a simple structure. Ferroelectric random access memories (RAMs) having nonvolatile characteristics can be operated at high speed; thus, such ferroelectric RAM devices have been met with interest by memory chip producers.

In such devices, each ferroelectric memory cell is composed of a ferroelectric capacitor and a switching transistor, and stores a logic state of data (i.e., binary information "1" or "0") according to the electric polarization state of the ferroelectric capacitor. When a voltage is loaded to both ends of the ferroelectric capacitor, the ferroelectric material is polarized. Depending on the direction of the electric field applied across the ferroelectric capacitor, the ferroelectric material can have two polarization directions. A first direction can be used to represent a data "1", the other direction "0". In this case, a switching voltage to cause the polarization is called as a coercive voltage. The data stored in the cell is sensed in response to a change in the amount of electric charge loaded into a bit line, by loading a difference voltage at both ends of the ferroelectric capacitor.

FIG. 1 is a circuit diagram for illustrating a memory cell MC composed of 1-transistor and 1-capacitor (1T/1C). The memory cell MC is composed of a switching transistor TR and a ferroelectric capacitor CF. That is, the memory cell MC is composed of 1-transistor and 1-capacitor for each bit of memory storage. The switching transistor TR has two main electrodes coupled to one end of the ferroelectric capacitor CF and a bit line BL, respectively, a drain, a source, and a gate coupled to a word line WL. Another end of the ferroelectric capacitor CF is coupled to a pale line PL.

Reading/writing operations of the memory call MC are illustrated with reference to FIG. 2. As shown in FIG. 2, the ferroelectric capacitor CF exhibits hysteresis characteristics against a voltage across the both ends. Thus, 1 bit of data is stored to the ferroelectric capacitor CF as a difference of polarization P between polarization state points 'a' and 'e' when the applied voltage is zero (i.e., V=0). The 1 bit data of "1" and "0" correspond with the polarization state points 'a' and 'e', respectively. This relationship is described as follows.

Suppose that the ferroelectric capacitor CF at the polarization state point 'a' stores a data value "1". When the switching transistor TR is turned on by loading a high voltage (i.e., power supply voltage Vcc) to the word line WL and a negative voltage −Ve is loaded to the ferroelectric capacitor CF through the bit line BL and the plate line PL (or, a pulse signal is loaded to the plate line PL), a polarization state P of the ferroelectric capacitor CF is changed from the polarization state point 'a' to a polarization state point 'd' via the polarization state points 'b' and 'c'. The electric charge Q1 corresponding to the state transition is transferred between the bit line BL and the ferroelectric capacitor CF through the switching transistor TR. The charge transfer is detected by a sense amplifier (not shown) coupled to the bit line BL, and the transfer means that the data "1" is read out from the memory cell MC. After reading out the data "1" from the memory cell MC, the data "1" on the bit line BL is written back to the memory cell MC by loading a pulse signal to the plate line PL. The writing result causes a reverse state transition from the polarization state point 'e' to a polarization state point 'h' via polarization state points 'f' and 'g'.

However, as shown in FIG. 2, in case that the ferroelectric capacitor CF at the polarization state point 'e' stores a data "0", a polarization state P of the ferroelectric capacitor CF is changed from the polarization state point 'e' to the polarization state point 'd' via the polarization state points 'e' and 'c', when the switching transistor TR is turned on by loading a high voltage (i.e., power supply voltage Vcc) to the word line WL and a negative voltage −Ve is loaded to the ferroelectric capacitor CF through the bit line BL and the plate line PL (or, a pulse signal is loaded to the plate line PL). The electric charge Q0 corresponding to the state transition is transferred between the bit line BL and the ferroelectric capacitor CF through the switching transistor TR. The charge transfer is detected by a sense amplifier (not shown) coupled to the bit line BL, and the transfer means that the data "0" is read out from the memory cell MC.

In a ferroelectric RAM device, a memory cell array is provided as shown in FIG. 1. The memory cells are arranged as a matrix format intersecting a plurality of rows and columns. Each of memory cells is coupled to a corresponding word line and a plate line. When a certain word line is selected to perform a read/write operation, as well known to a person skilled in the art, one end of the ferroelectric capacitor CF coupled to the plate line corresponding to respective unselected word lines, is floated during the read/write operation. Therefore, the voltage level between the both ends of the ferroelectric capacitor CF may be changed by adjacent signals. In other words, the floated plate lines may be boosted by adjacent signals. In this case, the polarization state of the ferroelectric capacitor CF coupled to the floated plate line is changed as much as the voltage variation between the both ends of the capacitor CF. Thus, it is possible that the data stored in the memory cell MC can be compromised.

SUMMARY OF THE INVENTION

It is therefore an object of the present invention to provide a ferroelectric memory device for preventing the boosting of voltage in unselected plate lines by adjacent signals.

In order to attain the above objects, according to an aspect of the present invention, there is provided a nonvolatile memory device comprising: a first word line; a plurality of second word lines corresponding to the first word line; a plurality of plate lines corresponding to the respective second word lines; a plurality of memory cells coupled to the respective second word lines, wherein each of memory cells has a transistor for transferring electric charges and a ferroelectric capacitor; and a plate line driving circuit coupled to the plate lines, for transmitting a plate line drive signal to the plate lines when the first word line is selected, and for connecting the plate lines to the first word line when the first word line is unselected.

In a preferred embodiment, the plate line driving circuit comprises: a first switching element for transmitting the plate line drive signal to the plate lines in response to a signal on the first word line; and a second switching element for connecting the plate lines and the first word line, electrically, when the plate line drive signal is activated. The first and second switching elements preferably comprise transistors, for example N-type MOS transistors.

A third switching element is preferably coupled between a control electrode of the first switching element and the first word line, wherein the third switching element is composed of a transistor that is inactivated to raise a voltage level of the control electrode when the first word line is selected. The transistor of the third switching element is preferably an N-type MOS transistor.

A plurality of precharge transistors may be provided for grounding corresponding plate lines, wherein the precharge transistors are controlled in common by a precharge enable signal.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A ferroelectric random access memory (RAM) device according the present invention includes an array of cells adopting a hierarchical word line structure and a folded bit line structure. These structures are generally applicable to use in memories (e.g., dynamic RAM devices). It is apparent to those of ordinary skill in the art that another bit line structure, for example, an open bit line structure, can also be used for the ferroelectric RAM device.

In a hierarchical word line structure, an upper word line is referred to as a main word line (MWL), and a lower word line is referred to as a sub-word line (SWL), respectively. The proportion of main word lines (or, global word line) to sub-word lines is set to 1 to n (i.e., 1:n), where n is set as a positive integer equal to two or greater. In the preferred embodiment of the present invention described herein, the proportion of main word lines to sub-word lines is set to 1 to 4 (i.e., 1:4).

Figure 3:
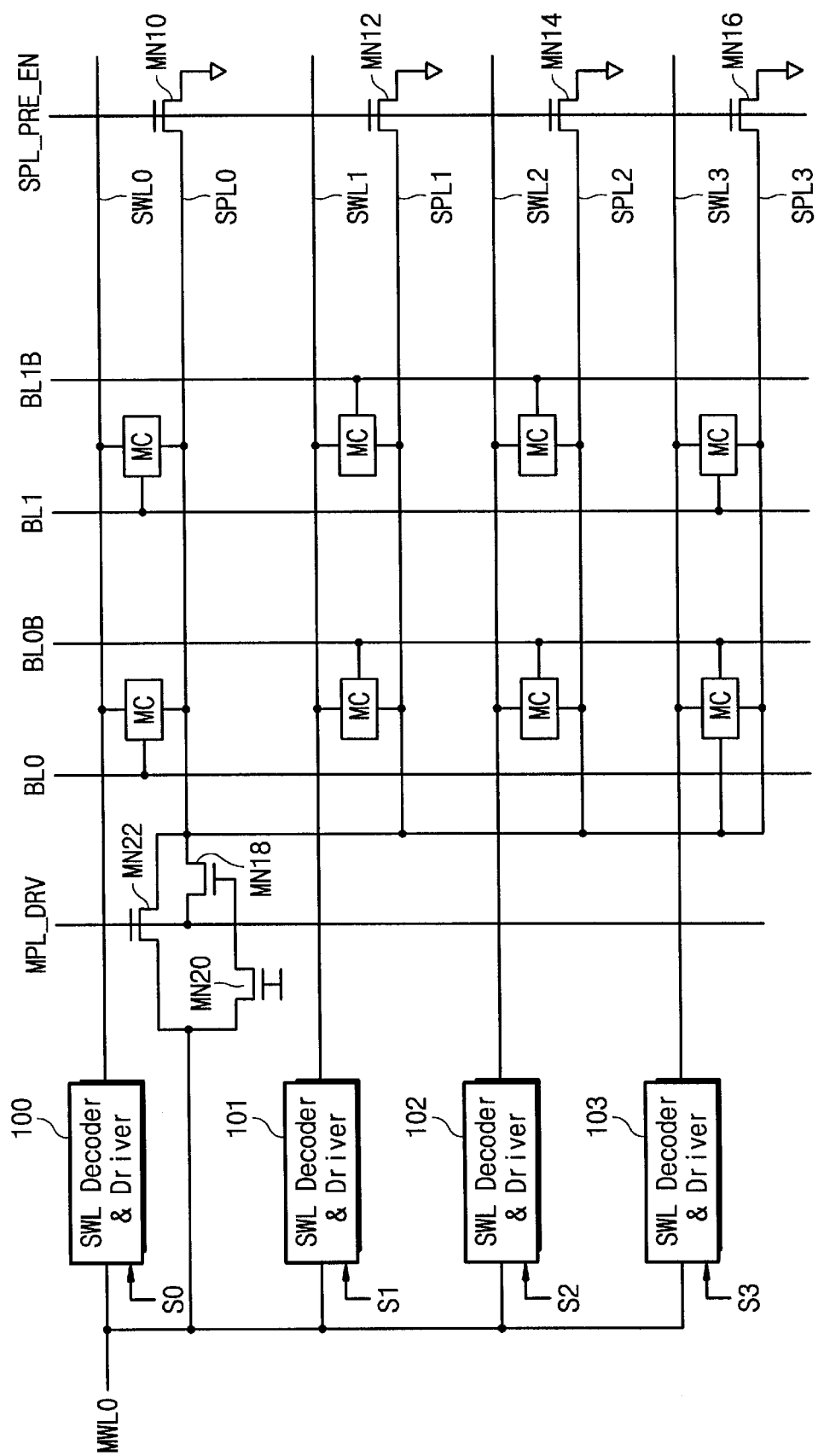
FIG. 3 is a circuit diagram for illustrating a ferroelectric random access memory cell array according to the present invention.

FIG. 3 is a circuit diagram for illustrating a ferroelectric random access memory cell array according to a preferred embodiment of the present invention. In FIG. 3, only one main word line and an array structure corresponding to the main word line are shown. However, it is apparent that circuit patterns corresponding to other main word lines are similarly constructed as shown in FIG. 3.

Referring to FIG. 3, a ferroelectric RAM device comprises a main word line MWL0. To the main word line MWL0, four sub-word line driving and decoding circuits 100–103 are coupled. Each sub-word line driving and Rio decoding circuit is marked to a SWL decoder & driver in FIG. 3, briefly. The four sub-word line driving and decoding circuits 100–103 each receive corresponding selection signals S0–S3, and are connected to corresponding sub-word lines SWL0–SWL3, respectively. When one of the selection signals S0–S3 is activated, the remainder of the selection signals are not activated. When a main word line MWL0 is selected and one of the selection signals is activated, the sub-word line driving and decoding circuit corresponding to the activated selection signal drives a corresponding sub-word line with a predetermined word line voltage.

Figure 1:
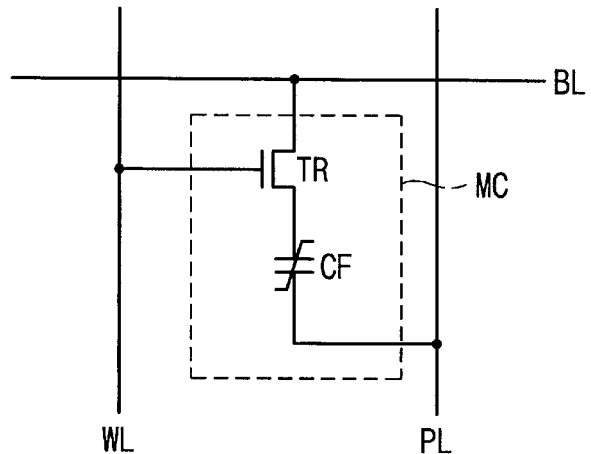
FIG. 1 is a circuit diagram for illustrating a convention 1-transistor/1-capacitor memory cell.
Figure 2:
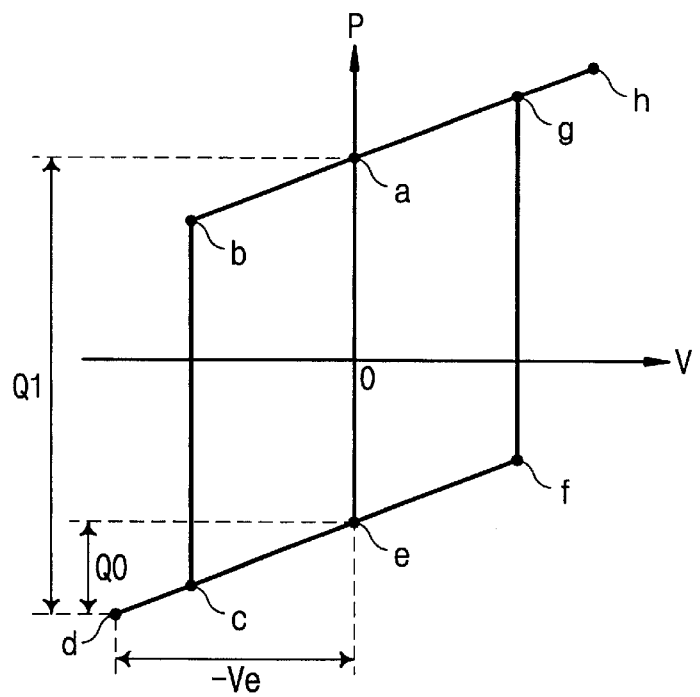
FIG. 2 is a chart for illustrating hysteresis characteristics of a ferroelectric capacitor.

The ferroelectric RAM device further comprises a plurality of memory cells MCs arranged in plural rows and columns. Each of memory cells MCs is constructed as shown in FIG. 1. A memory cell MC connected to each row is coupled between a corresponding sub-word line SWLi (i=0 to 3) and a plate line SPLi. The memory cell MC connected to each column is coupled to a pair of bit lines BLj and BLjB (j=0, 1), alternately, in the pattern of a folded bit line structure. NMOS transistors MN10–MN16 are used for precharging the plate lines SPL0–SPL3, and are coupled to the plate lines SPL0–SPL3, respectively. The transistors MN10–MN16 are controlled in common by a precharge enable signal SPL_PRE_EN. The bit lines BL0, BL0B, BL1, and BL1B are couples to a sense amplifier, not shown in FIG. 3.

Continuing to refer to FIG. 3, four plate lines SPL0–SPL3 corresponding to a common main word line MWL0 are coupled commonly to a plate drive line MPL_DRV through an NMOS transistor MN18. A gate of the NMOS transistor MN18 is coupled to the main word line MWLO through an NMOS transistor MN20 having a gate coupled to a power supply voltage source. The plate lines SPL0–SPL3 are coupled commonly to the main word line MWL0 through an NMOS transistor MN22 having a gate coupled to the plate drive line MPL_DRV.

The NMOS transistors MN18–MN22 construct a plate line driving circuit, and transfer the plate line drive signal MPL_DRV into corresponding plate lines SPL0–SPL3 when the main word line is selected. On the other hand, when the main word line is unselected, the plate line driving circuit causes the corresponding plate lines SPL0–SPL3 to connect to the unselected main word line having a ground voltage level.

Figure 4:
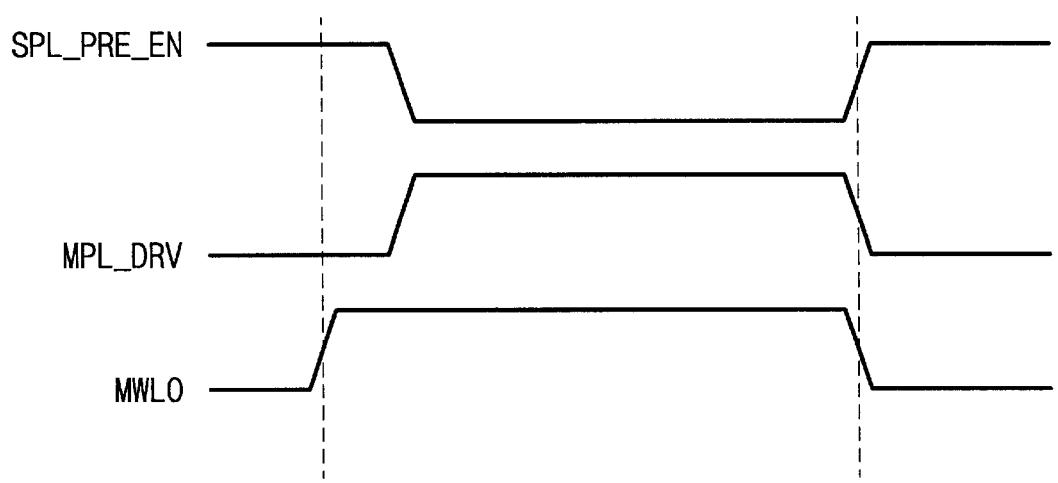
FIG. 4 is a timing diagram for illustrating the timing of control signals for the memory cell array shown in FIG. 3.

FIG. 4 is a timing diagram for illustrating the timing of control signals for the memory cell array shown in FIG. 3. The operations of the ferroelectric RAM device according to the present invention are illustrated as follows, with reference to FIGS. 3 and 4.

As shown in FIG. 4, when the precharge enable signal SPL_PRE_EN maintains a first logic state (e.g., high) (i.e., when no read/write operation is performed), the NMOS transistors MN10–MN16 for precharging the plate line are activated. Thus, the plate lines SPL0–SPL3 corresponding to the main word line MWL0 are grounded. Therefore, the voltage variation of the plate lines is prevented during a standby mode or during cycles of read/write operations.

As shown in FIG. 4, the main word line MWL0 is selected to have a logic high state. At this time, at least one selection signal S0, S1 or S3 being loaded to the sub-word line deriving and decoding circuits 100–103 is activated. Thus, a sub-word line SWLi corresponding to the activated selection signal has a logic high state. In addition, a voltage of Vcc–Vth (where, Vth is a threshold voltage of an NMOS transistor) is loaded to a gate of the NMOS transistor MN18 through the NMOS transistor MN20, as main word line MWL0 has a low-to-high transition. Thus, the NMOS transistor MN20 is turned off (or, inactive).

Subsequently, the precharge enable signal SPL__PRE__EN has a high-to-low transition, but on the other hand, a plate line drive signal MPL__DRV has a low-high transition. When the plate line drive signal MPL__DRV is changed from a logic low state to a logic high state, the gate voltage of the NMOS transistor MN18 (i.e., Vcc–Vth) is raised according to a boosting technique for transferring the voltage of the plate line drive signal MPL__DRV into the plate drive line, sufficiently, without voltage drop. The read/write operation is performed in response to the transmitting of the plate line drive signal MPL__DRV.

Since unselected main word lines keep logic low states, the NMOS transistor MN18 corresponding to each of unselected word lines is turned off. Thus, the plate line drive signal MPL__DRV is not transmitted to the plate lines SPL0–SPL3 corresponding to each of unselected word lines. Namely, the plate lines SPL0–SPL3 corresponding to respective unselected word lines are in a floating stste, which means that the voltage level of the plate lines SPL0–SPL3 can be changed by coupling with adjacent signals.

However, since the NMOS transistor MN22 corresponding to the respective unselected main word lines is tuned on by the plate line drive signal MPL__DRV, the plate lines SPL0–SPL3 corresponding to the respective unselected main word lines are connected to the corresponding unselected main word line having a ground voltage level, through active NMOS transistor MN22. In this case, the plate lines SPL0–SPL3 are grounded rather than in a floating state.

In this condition, data is read/written to/from the memory cell related to the selected sub-word line. Then, as shown in FIG. 4, the selected main word line signal MWL0 and the plate line drive signal MPL__DRV undergo a high-to-low transition, and the precharge enable signal SPL__PRE__EN has a low-to-high transition, respectively. According to the low-to-high transition of the precharge enable signal SPL__PRE__EN, the NMOS transistors MN10–MN16 coupled to the respective plate lines SPL0–SPL3 of the main word lines are turned on, so that the plate lines are precharged to the ground voltage level.

Therefore, it is possible to prevent a floating condition in the plate lines corresponding to the unselected main word line, as the unselected main word line connects the plate lines corresponding to the main word line during a normal mode of operation.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A nonvolatile memory device comprising:
   a first word line;
   a plurality of second word lines corresponding to the first word line;
   a plurality of plate lines corresponding to the respective second word lines;
   a plurality of memory cells coupled to the respective second word lines, wherein each of the memory cells comprises a transistor for transferring electric charge and a ferroelectric capacitor; and
   a plate line driving circuit coupled to the plate lines, for transmitting a plate line drive signal to the plate lines when the first word line is selected, and for connecting the plate lines to the first word line when the first word line is unselected.

2. The nonvolatile memory device according to claim 1, wherein the plate line driving circuit comprises:
   a first switching element for transmitting the plate line drive signal to the plate lines in response to a signal on the first word line; and
   a second switching element for connecting the plate lines and the first word line, electrically, when the plate line drive signal is activated.

3. The nonvolatile memory device according to claim 2, wherein the first and second switching elements comprise transistors.

4. The nonvolatile memory device according to claim 3, wherein the transistors comprise N-type MOS transistor.

5. The nonvolatile memory device according to claim 3, further comprising a third switching element coupled between a control electrode of the first switching element and the first word line, wherein the third switching element is composed of a transistor that is inactivated to raise a voltage level of the control electrode when the first word line is selected.

6. The nonvolatile memory device according to claim 5, wherein the transistor of the third switching element is an N-type MOS transistor.

7. The nonvolatile memory device according to claim 1, further comprising a plurality of precharge transistors for grounding corresponding plate lines, wherein the precharge transistors are controlled in common by a precharge enable signal.

* * * * *